(12) United States Patent
Tsang (10) Patent No.: US 7,651,939 B2
(45) Date of Patent: Jan. 26, 2010

(54) METHOD OF BLOCKING A VOID DURING CONTACT FORMATION

(75) Inventor: Yuk L. Tsang, Austin, TX (US)

(73) Assignee: Freescale Semiconductor, Inc, Austin, TX (US)

( * ) Notice: Subject to any disclaimer, the term of this patent is extended or adjusted under 35 U.S.C. 154(b) by 240 days.

(21) Appl. No.: 11/742,942

(22) Filed: May 1, 2007

(65) Prior Publication Data
US 2008/0272492 A1 Nov. 6, 2008

(51) Int. Cl.
*H01L 21/4763* (2006.01)
(52) U.S. Cl. .............. 438/618; 438/619; 257/E21.494; 257/E23.152
(58) Field of Classification Search .......... 438/618, 438/619
See application file for complete search history.

(56) References Cited
U.S. PATENT DOCUMENTS
6,184,073 B1   2/2001   Lage et al.
6,228,731 B1 *   5/2001   Liaw et al. ................ 438/303
6,274,426 B1   8/2001   Lee et al.
6,369,430 B1 *   4/2002   Adetutu et al. ............ 257/382

FOREIGN PATENT DOCUMENTS
EP   0915501 A1   12/1999

* cited by examiner

*Primary Examiner*—Alexander G Ghyka (57) ABSTRACT

An electronic device can include conductive regions. A void can extend between different portions of an insulating layer. Different openings can intersect the void. A liner layer can substantially block the void, substantially preventing subsequently forming an electrical leakage path along the void. In one aspect, a stressor layer can be deposited over the conductive regions prior to forming the insulating layer. The liner layer can be formed over the stressor layer within the different openings through the insulating layer. In another aspect, an etch-stop layer can be formed over a silicide layer prior to forming the insulating layer. After removing a portion of the liner layer, a portion of the etch-stop layer can be removed to expose the silicide layer within the different openings. In yet another aspect, a nitride layer can lie between a substrate and the insulating layer and include a section of the openings.

20 Claims, 6 Drawing Sheets

METHOD OF BLOCKING A VOID DURING CONTACT FORMATION

BACKGROUND

1. Field of the Disclosure

This disclosure pertains, in general, to semiconductor processing and, more specifically, to forming an integrated circuit device with contact openings.

2. Description of the Related Art

Interconnect technology is a factor in the ability to reduce the area of integrated circuit devices. Multi-level metallization layouts have assisted dimension shrinkage by having multiple metal lines share the same area of the device. In a multi-level metallization layout, a dielectric layer, termed an interlevel dielectric layer ("ILD") or a pre-metal dielectric ("PMD") layer, is formed between the first metal layer and the transistors. Typically, the dielectric layer is formed to isolate the metal layer from the transistors. To electrically connect the underlying gates of the transistors or the substrate (i.e. the source or drain region) to the first metal line, a contact opening is etched through the ILD layer and filled with a conductive material to form a conductive plug. Typically, a contact opening is formed between two transistors. These contact openings are desirably small so the transistors may be close together, but must also be reliable.

In one example, a PMD process leaves a void when depositing between two closely spaced gate electrode structures. Neighboring contact openings are formed in a PMD layer exposing a source/drain region within each opening. A void undesirably extends between the two neighboring contact openings along the two closely spaced gate electrode structures. An insulating liner layer can be deposited within the neighboring contact openings. The insulating layer constricts the void at the contact opening. The insulating layer can subsequently be anisotropically etched to allow electrical contact to be made to the source/drain region. However, exposing the source/drain region more than once during a contact opening formation sequence can negatively affect the resistivity of the source/drain region. There, thus, is a need for contacts that are reliable and allow for transistors to be close together that overcomes these problems.

BRIEF DESCRIPTION OF THE DRAWINGS

The present disclosure may be better understood, and its numerous features and advantages made apparent to those skilled in the art by referencing the accompanying drawings. The subject of the disclosure is illustrated by way of example and not limitation in the accompanying figures in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

An electronic device can include different conductive regions. The electronic device can also include an insulating layer including a void extending between different portions of the insulating layer. A section of one opening through a portion of the insulating layer and another section of another opening through the other portion of the insulating layer can intersect the void. A liner layer can lie within the sections of the openings and substantially block the void.

In one aspect, a stressor layer can be deposited over the conductive regions prior to forming the insulating layer, and the liner layer can be formed over the stressor layer within the openings. In another aspect, a silicide layer can be formed over the conductive regions, and an etch-stop layer can be formed over the silicide layer prior to forming the insulating layer. The liner layer can be formed within one opening, the other opening, or any combination thereof, and a portion of the etch-stop layer can be removed to expose the silicide layer within the one opening and the other opening, after removing a portion of the liner layer. In yet another aspect, a nitride layer can lie between the substrate and the insulating layer. Another section of the opening through the nitride layer can, from a top view, lie within the section of the same opening through the insulating layer.

Thus, forming the electronic device includes forming an insulating layer overlying a protective layer. The protective layer can serve as an insulating layer, a stressor layer, an etch-stop layer, or any combination thereof. In one embodiment, the protective layer includes a nitrogen-containing material. A void in the insulating layer that undesirably connects or provides a leakage path between different contact openings through the insulating layer can be substantially blocked by depositing a liner layer prior to removing the protective layer within the contact openings. By substantially blocking the void, stringer formation within the void during subsequent formation of conductive plugs can be reduced or substantially eliminated. Also, by depositing the liner layer after exposing the void and before removing the protective layer within the contact openings, contact regions below the contact openings are exposed only once during the contact opening formation sequence. In a particular embodiment, the contact region can include a silicide layer. In a more particular embodiment, exposing the silicide layer during forming the liner layer is substantially avoided. Specific embodiments of the present disclosure will be better understood with reference to FIGS. 1 through 11.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

Figure 1:
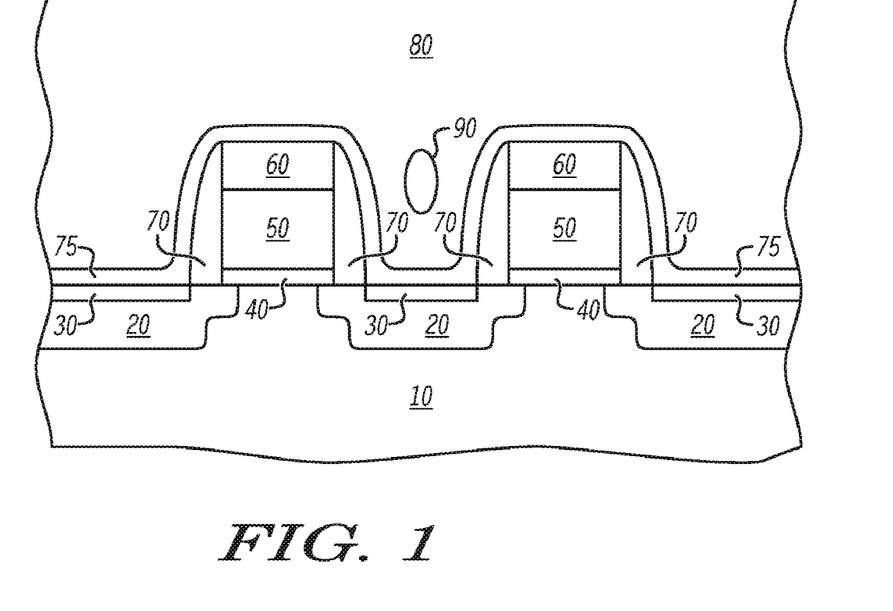
FIGS. 1 and 2 include illustrations of cross-sectional views of a portion of a semiconductor substrate illustrating voids in an ILD layer.

FIG. 1 includes an illustration of a cross-sectional view in a first direction of a portion of a partially formed electronic device including a void 90 formed as a result of two transistors being close together. Doped regions 20, such as sources and drains, are formed at semiconductor substrate 10. Substrate 10 can be monocrystalline or polycrystalline silicon, gallium arsenide, germanium, silicon-on-insulator ("SOI"), and the like. The doped regions 20 can be formed using a conventional or proprietary process. In one embodiment, the substrate 10 is monocrystalline silicon and doped regions 20 are formed using ion implantation. For example, doped regions 20 can be formed by doping substrate 10 with phosphorus, boron, or arsenic depending on the conductivity type required. Doped regions 20 serve as conductive regions. In a particular embodiment, a complementary metal oxide semiconductor ("CMOS") device is formed with some doped regions 20 including n-doped regions and some doped regions 20 including p-doped regions. Within doped regions 20, silicide regions 30 are formed using conventional processing. In a particular embodiment, the silicide region 30 includes europium, nickel, titanium, ytterbium, yttrium, cobalt, or any combination thereof. Gate dielectric 40 can be $SiO_2$, a mid-k dielectric, such as $SiO_xN_y$, or silicon nitride, or a high-K dielectric material such as $ZrO_2$, $HfO_2$, or silicates. Gate electrode 50 is formed over gate dielectric 40 and is, typically, polysilicon. In other embodiments, gate electrodes can comprise a metal. Spacers 70 and capping layer 60 are, typically, dielectric materials. For example, each of spacers 70 and capping layer 60 can include silicon nitride, or silicon dioxide. Spacers 70 and capping layer 60 may or may not include the same material. Gate dielectric 40, gate electrode 50, capping layer 60, and spacers 70 can be formed using a conventional or proprietary process. The capping layer 60 is optional and may or may not be present.

A protective layer 75 can be formed over substrate 10. Protective layer 75 includes an insulating material. In one embodiment, protective layer 75 can act as an etch stop during a subsequently performed etch process. Any insulating material with an etch selectivity to the subsequently formed ILD of less than 1 to 1 can be used for protective layer 75. In another embodiment, protective layer 75 can act as a stressor layer and have a tensile stress above an n-doped region and a compressive stress above a p-doped region. In a still another embodiment, protective layer 75 can include a nitrogen-containing material. In a particular embodiment, protective layer 75 includes silicon nitride. Protective layer 75 can be formed using a conventional or proprietary chemical vapor deposition ("CVD") process, plasma enhanced CVD ("PECVD") process, atomic layer deposition ("ALD") process, or any combination thereof. Protective layer 75 can have a thickness in a range of 20 to 80 nm.

Interlevel dielectric ("ILD") layer 80 can act as an insulating fill and is deposited over substrate 10. In one embodiment, ILD layer 80 can serve as a PMD layer. The ILD layer 80 can also provide insulating between conducting layers, conducting elements, or any combination thereof stacked one over the other. ILD layer 80 is nitride silicate glass oxide, undoped silicate glass oxide, spin-on glass ("SOG") oxide, metal oxide, undoped TEOS (tetraethylorthosilicate) oxide, or any combination thereof. The ILD layer 80 may be doped or undoped. Different combinations of ILD materials and formation processes exhibit different ability to fill gaps between structures. Deep and narrow gaps are typically more difficult to fill than shallower and wider gaps. An ILD material and formation process combination has an aspect ratio limit, or a ratio of the depth of the gap to the width of the gap that can be reliably filled. A gap exceeding the aspect ratio limit is likely to include a void within the gap after deposition of the ILD material. In one embodiment, the distance between the two illustrated transistors is approximately 100 nanometers, and the thickness of the transistor stacks and ILD layer 80 between the transistor stacks is approximately 300 nanometers, resulting in an aspect ratio of approximately 3 to 1. Void 90 can be formed during the deposition of ILD layer 80 if the aspect ratio limit is not less than 3 to 1. Although only two transistors are illustrated in FIG. 1, more transistors are usually formed. For example, at least two additional transistors are formed in a row either behind or in front of the two illustrated transistors of FIG. 1.

Figure 2:
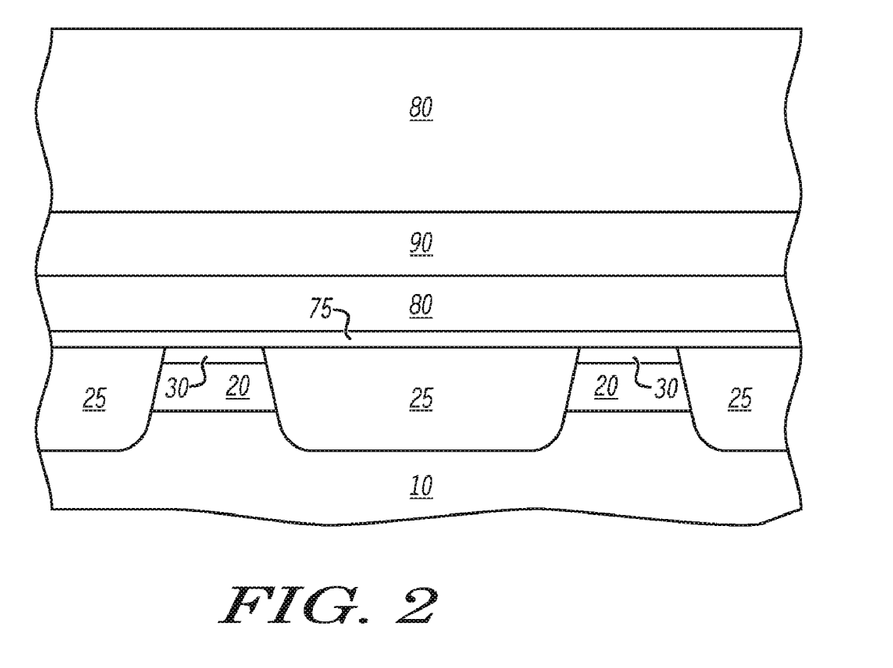
Figure 3:
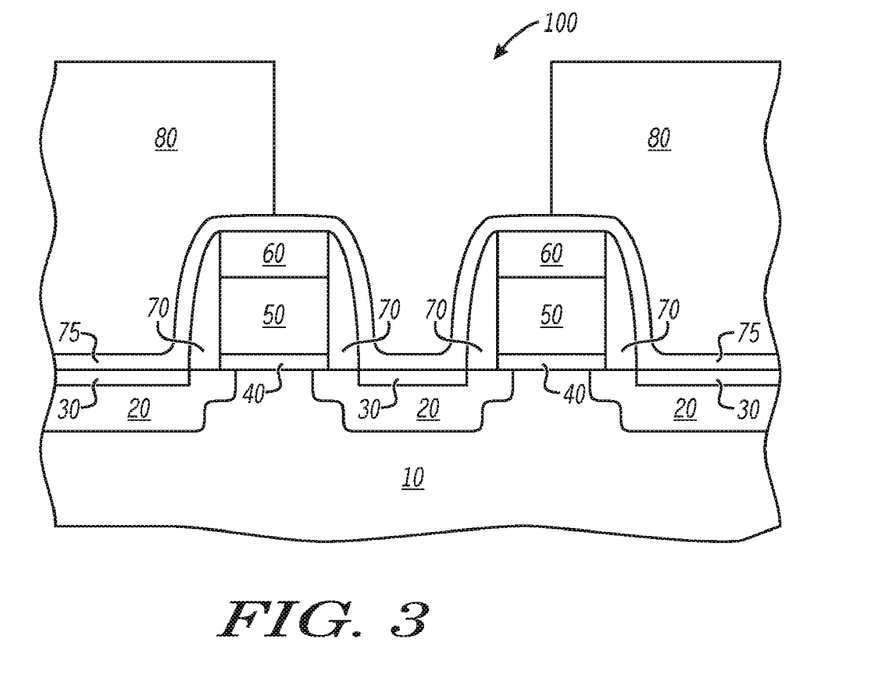
FIGS. 3 and 4 include illustrations of cross-sectional views of a portion of the semiconductor substrate of FIGS. 1 and 2, after forming a section of a contact opening in the ILD layer that exposes the void.

FIG. 2 illustrates a cross-section in a second direction, which is along void 90. As illustrated in FIG. 2, the silicide regions 30 within shared doped regions 20 lie between two pairs of transistor stacks, each pair of transistor stacks sharing doped regions 20. The presence of void 90 extending in a second direction, which is perpendicular to the first direction, is illustrated within ILD layer 80.

Figure 4:
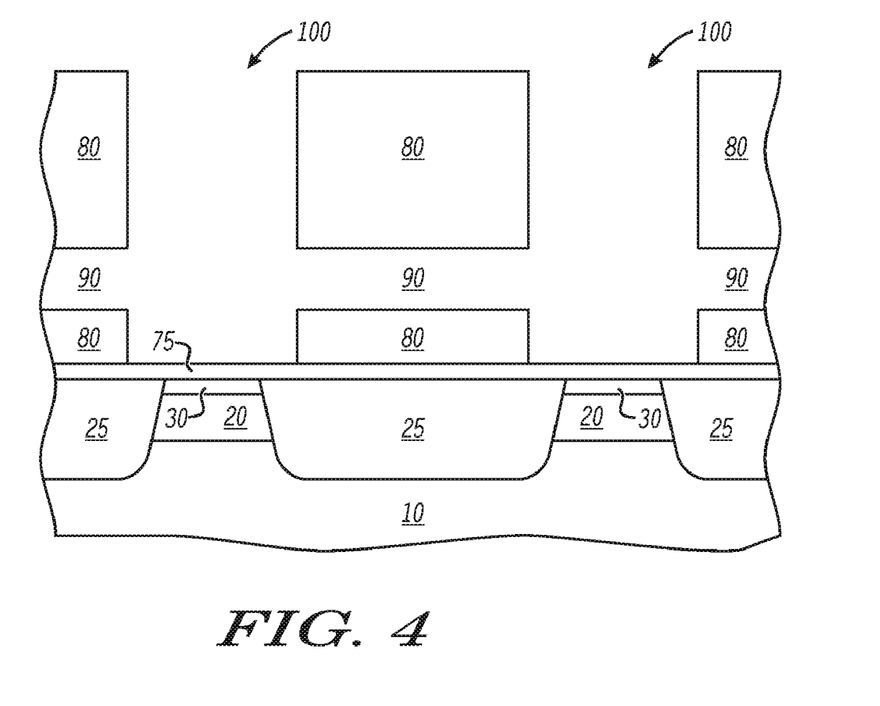

A photoresist layer (not illustrated) is deposited over ILD layer 80 of FIGS. 1 and 2 and patterned for contact openings 100 having sidewalls and bottoms. Sections of contact openings 100 are then etched within ILD layer 80 between the two illustrated transistors of FIG. 1. Portions of the ILD layer 80 overlying doped regions 20 are removed selectively with respect to the protective layer 75 resulting in forming sections of contact openings 100 as illustrated in the cross-sections of FIGS. 3 and 4. Although void 90 is not illustrated in FIG. 3, it still exists. As illustrated in FIG. 4, void 90 lies between and undesirably connects the contact openings 100 over one doped region 20 and another doped region 20 shared by two other transistors. The photoresist layer is removed using a conventional or proprietary process after forming sections of the contact openings 100.

Figure 5:
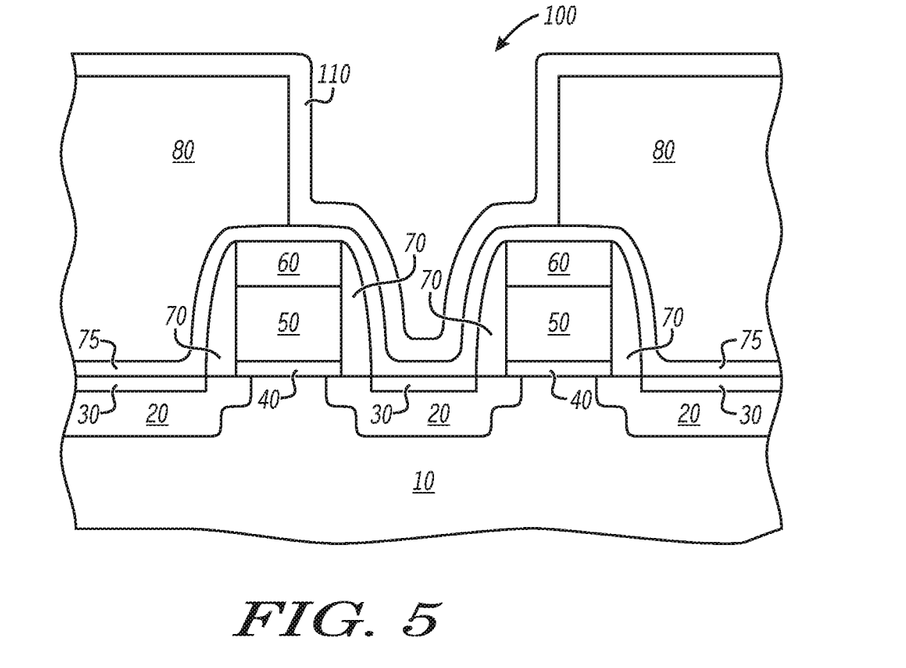
FIGS. 5 and 6 include illustrations of cross-sectional views of a portion of the semiconductor substrate of FIGS. 3 and 4, after forming a liner layer within the section of the opening.
Figure 6:
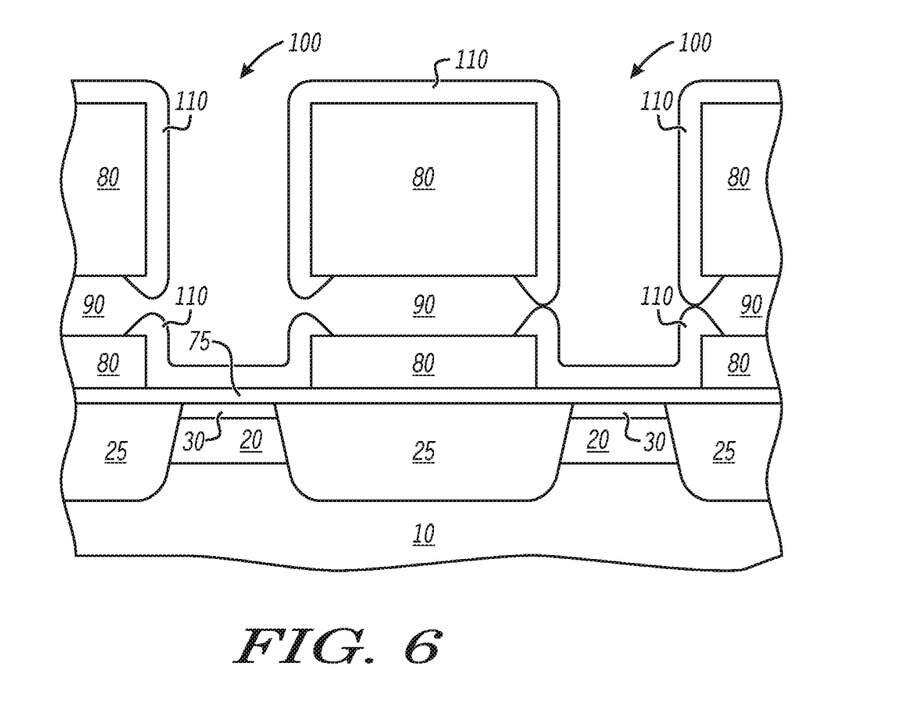

Illustrated in FIGS. 5 and 6 is a structure resulting from liner layer 110 being deposited within contact openings 100 and substantially blocking void 90 extending between contact openings 100. By substantially blocking void 90, subsequently formed conductive material can be substantially prevented from extending along the entire length of void 90 between the contact openings 100. Liner layer 110 overlies the protective layer 75 within contact openings 100. Liner layer 110 can serve as an insulating layer and include a dielectric material such as an oxide, a nitride, an oxynitride, or any combination thereof. In a particular embodiment, the liner layer 110 includes an oxygen-containing material and formed at a temperature not greater than 450 degrees centigrade. In another particular embodiment, the liner layer 110 includes a nitrogen-containing material, such that the liner layer 110 and the protective layer 75 can be subsequently removed using the same etch chemistry. Liner layer 110 can be formed using a conventional or proprietary CVD process, plasma enhanced chemical vapor deposition ("PECVD") process, PVD process, ALD process, or any combination thereof. The thickness of liner layer 110 is at most approximately one third the diameter of contact opening 100, such that the contact opening 100 remains at least partially open after depositing the liner layer 110. In a particular embodiment, the thickness of the liner layer 110 is in a range of approximately 5 percent to approximately 15 percent of the diameter of the contact opening 100.

As illustrated in FIG. 6, liner layer 110 can extend into void 90. Liner layer 110 decreases the size of the opening to void 90 and in one embodiment, completely cover the opening of void 90. Thus, liner layer 110 substantially blocks the void 90 and helps prevent subsequently formed metal layer from depositing along void 90, as will be further explained.

Figure 7:
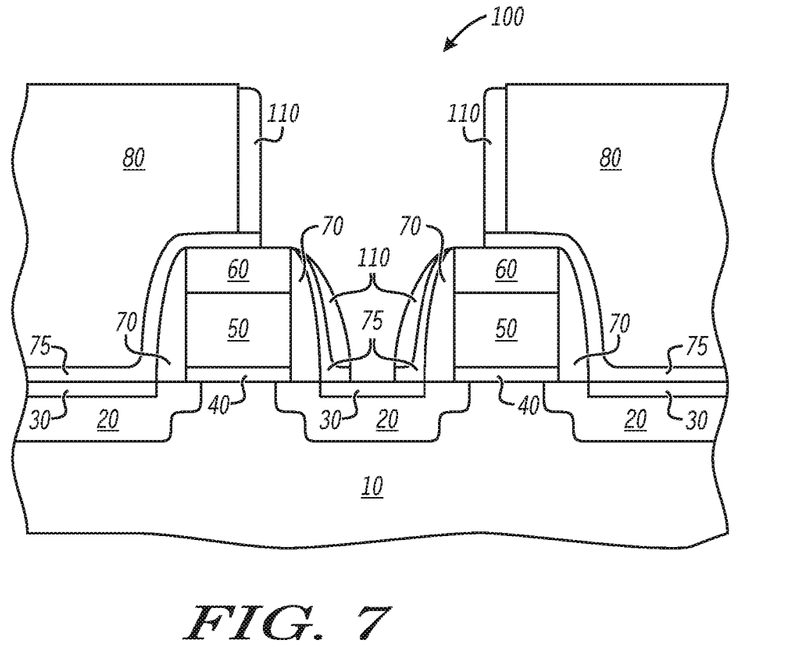
FIGS. 7 and 8 include illustrations of cross-sectional views of a portion of the semiconductor substrate of FIGS. 5 and 6, after forming another section of the contact opening.
Figure 8:
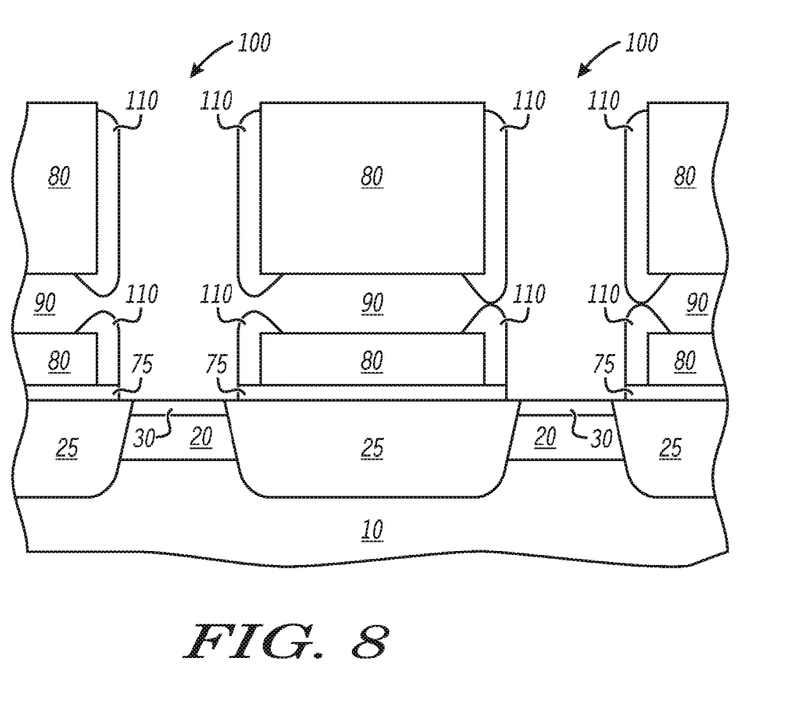
Figure 9:
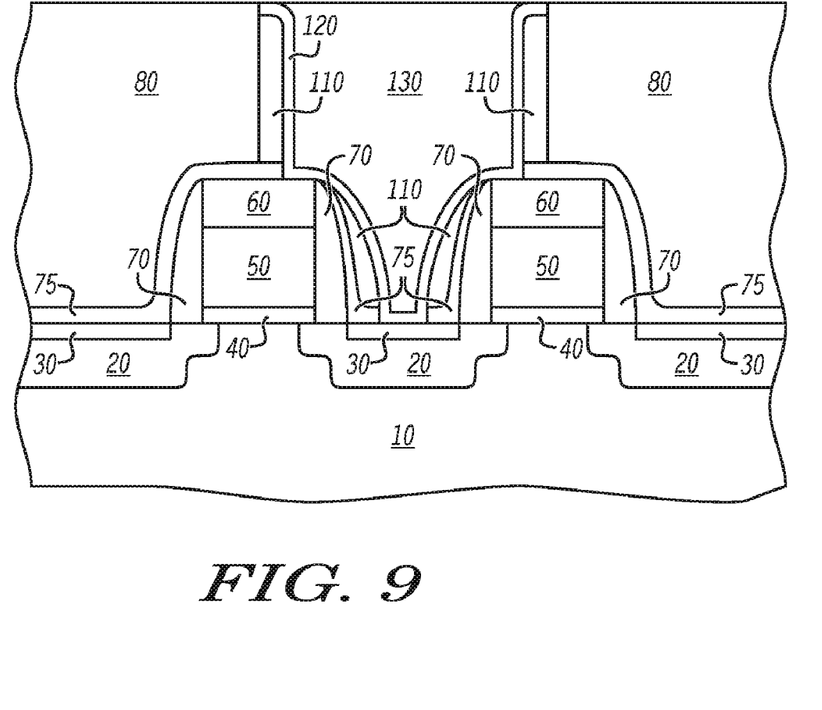
FIGS. 9 and 10 include illustrations of cross-sectional views of a portion of the semiconductor substrate of FIGS. 7 and 8 after forming another liner layer and metal layer in the contact opening.

After depositing liner layer 110, a portion of liner layer 110 and a portion of protective layer 75 within contact openings 100 are each subsequently removed to form other sections of contact openings 100. In one embodiment, forming other sections of contact openings 100 completes contact openings 100 and exposes silicide region 30 that lies between the two transistors. In another embodiment, a dry etch, typically used to etch the material chosen for liner layer 110, is used to remove a portion liner layer 110 prior to exposing silicide region 30, as illustrated in FIG. 7. The removal process is substantially anisotropic in order to leave liner layer 110 substantially covering the vertical sidewalls of contact openings 100, as illustrated in FIG. 8. In a particular embodiment, the removal process is performed as a blanket removal process, without an intervening masking layer. However, any process that removes liner layer 110 from the bottom of the contact openings 100 and does not remove a significant portion of liner layer 110 blocking void 90 can be used. Hence, a remaining portion of liner layer 110 can reduce the size of the opening of void 90 into the completed contact openings 100 so that a conductive layer cannot extend along the entire length of the void between the neighboring contact openings 100. In one embodiment, a remaining portion of liner layer 110 reduces the size of the opening into the void 90 so much that there is at least one blocked opening into void 90 from the contact openings 100.

If the subsequently formed metal layer 130 does not either adhere to liner layer 110 sufficiently or does not have a desired contact resistance, additional liner layer 120 may, optionally, be formed. Additional liner layer 120 can be conductive and include a single material or a stack of materials. In the event that additional liner layer 120 is a stack of materials, one material or group of materials could be chosen because of the good adhesion properties to liner layer 110 or subsequently formed metal layer 130. The other material or materials in the stack may be chosen to decrease the contact resistance of the overall conductive plug after additional liner layer 120 is formed. Additional liner layer 120 can be formed by PVD, CVD, metal organic chemical vapor deposition ("MOCVD"), ALD, or any combination thereof. Additional liner layer 120 can include a refractory metal, a refractory metal nitride, a conductive metal oxide, or any combination thereof. In one embodiment, additional liner layer 120 includes titanium nitride, titanium, tantalum, tantalum nitride, tungsten nitride (WN, $W_2N$), or any combination thereof. In another embodiment, additional liner layer 120 can include a seed layer to act as a plating surface to help initiate formation of a subsequently formed metal layer.

Figure 10:
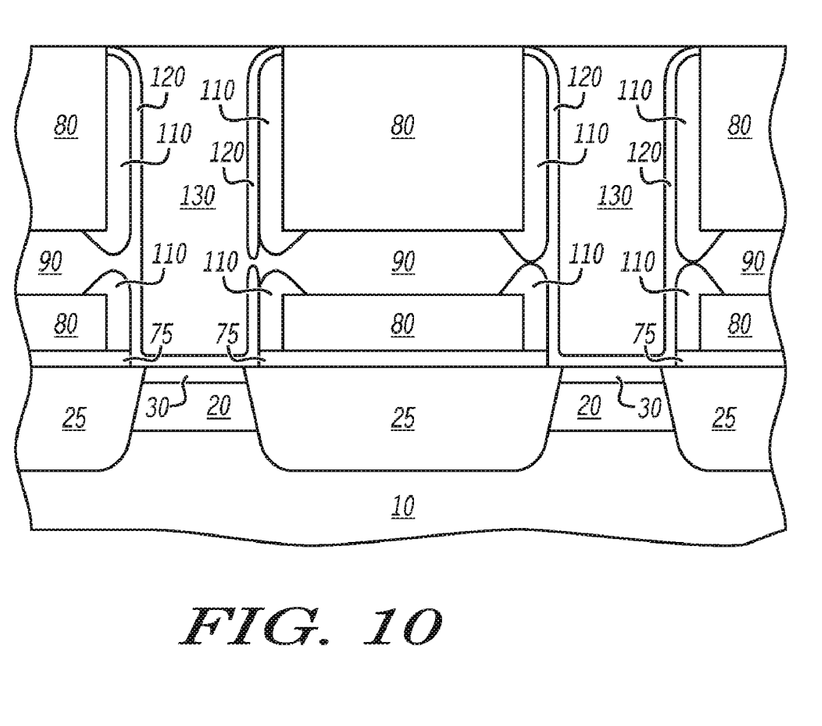

After additional liner layer 120 is deposited, metal layer 130 is formed. Metal layer 130 can be formed using a conventional or proprietary CVD, PVD, ALD, plating process, or any combinations thereof. Metal layer 130 can include any metal material. In one embodiment, tungsten, aluminum, copper, or any combination thereof is used. If aluminum is used, a reflow may be performed after deposition of metal layer 130. In one embodiment, metal layer 130 has a thickness in a range of approximately 100 to approximately 1000 nm. In a more particular embodiment, metal layer 130 has a thickness in a range of approximately 150 to approximately 500 nm. To planarize metal layer 130 and remove liner layer 120 from the top surface of ILD layer 80, a chemical mechanical polishing process is performed. In another embodiment, metal layer 130 and portions of additional liner layer 120 are etched back to produce the structure illustrated in FIG. 9. As illustrated in FIG. 10, additional liner layer 120 can further block the opening into void 90 left by liner layer 110. Liner layer 110, additional liner layer 120 or any combination thereof can substantially prevent a portion of the metal layer 130 from substantially extending along the entire length of void 90 between contact openings 100 and, thus, shorting of the conductive plugs by a portion of conductive layer 130 is avoided.

Figure 11:
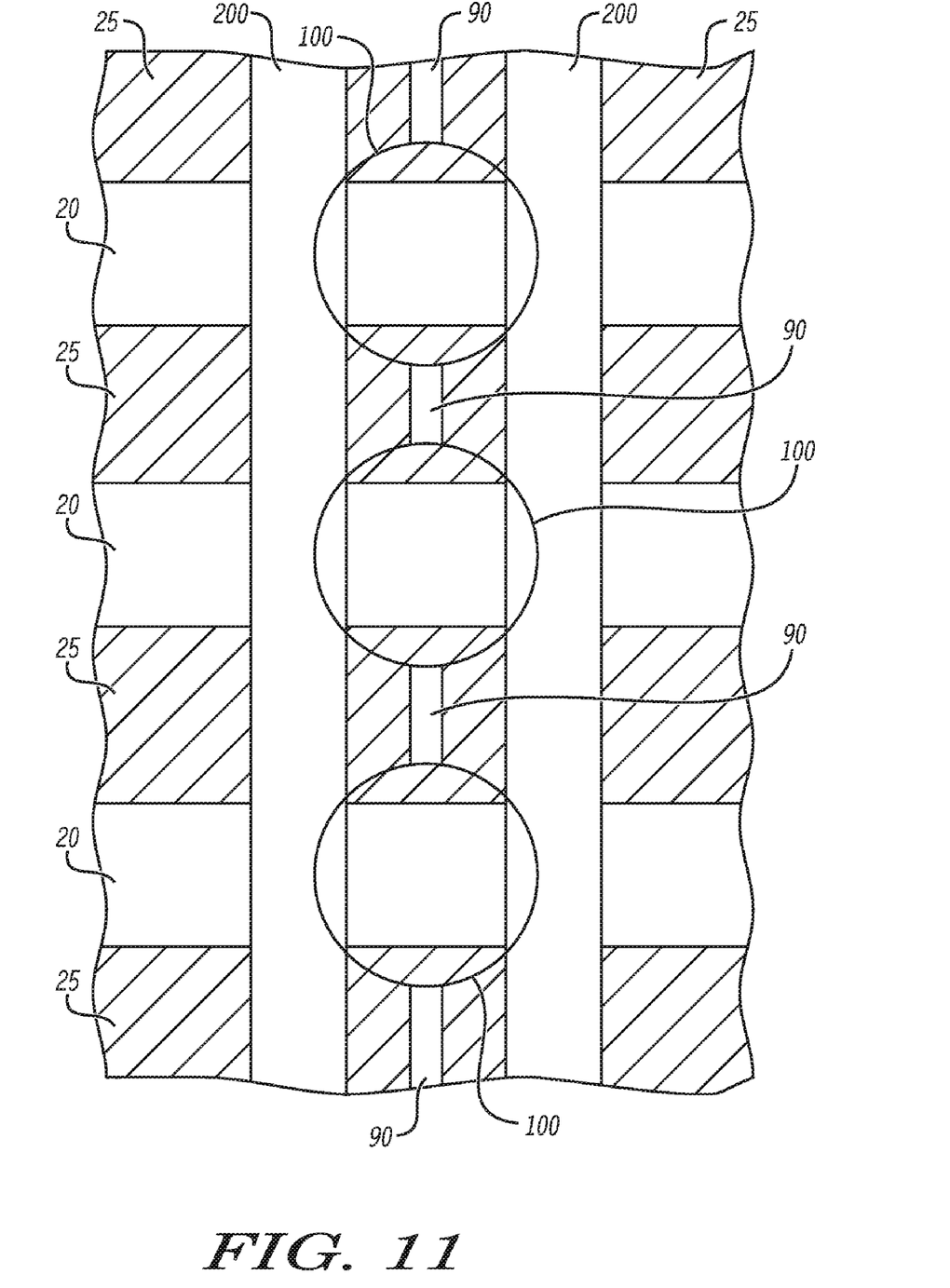
FIG. 11 includes an illustration of a top view of a portion of the semiconductor substrate of FIGS. 9 and 10.

FIG. 11 shows a top view of a portion of a semiconductor substrate after the process described in regards to FIGS. 1 though 10. The gate stack or transistors are located at the intersection of gate electrode lines 200 and doped regions 20. Doped regions 20 are separated from each other by isolation regions 25. As previously described, metal layer 130, additional liner layer 120, and liner layer 110 lie within the contact openings 100. Voids 90 extend between contact openings 100. If liner layer 110 does not substantially block the opening into void 90, a portion of metal layer 130 can extend along void 90, as previously describe, and thus create stringers, which electrically short or provide a leakage path between doped regions 20. Also, by depositing liner layer 110 after forming a section of the contact openings 100 and before completing contact openings 100, contact regions, such as the silicide layer 30 or the doped region 20 below the contact openings 100 are exposed only once during contact opening 100 formation sequence. Although not illustrated, an additional insulating layer, a conductive layer, and an encapsulating layer are formed using conventional or proprietary techniques. In another embodiment, a plurality of additional insulating layers, conductive layers, encapsulating layers, or any combination thereof is used to form the electronic device.

Although described above with respect to a void formed between identical gate electrode structures, in an alternative embodiment, a void can be formed between structures of different heights. Different contacts can intersect such a void, and the opening into the void can be blocked as described above. For example, within a nonvolatile memory array, such a void can exist between a control gate electrode and a select gate electrode of different heights. In another example, such a void is formed between two metal lines of different elevations.

In the foregoing specification, the disclosed method and device has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

Many different aspects and embodiments are possible. Some of those aspects and embodiments are described below. After reading this specification, skilled artisans will appreciate that those aspects and embodiments are only illustrative and do not limit the scope of the present invention.

In a first aspect, a process of forming an electronic device can include forming a first conductive region within a substrate corresponding to a first component. The process can also include forming a second conductive region within the substrate and adjacent to the first conductive region, wherein the second conductive region corresponds to a second component. The process can further include depositing a stressor layer including an insulating material over the first conductive region and the second conductive region. The process can still further include forming a first insulating layer over the stressor layer, wherein forming the first insulating layer includes forming a void within the first insulating layer and wherein, from a top view, the void lies between the first conductive region and the second conductive region. The process can also include forming a first opening through a first portion of the first insulating layer and a second opening through a second portion of the first insulating layer. The first portion can overlie the first conductive region, the second portion can overlie the second conductive region, and the void can connect the first opening and the second opening. The stressor layer can lie between the first conductive region and a bottom of the first opening, and between the second conductive region and a bottom of the second opening. The process can further include forming a second insulating layer over the stressor layer within the first opening, the second opening, or any combination thereof, wherein forming the second insulating layer includes substantially blocking the void.

In a particular embodiment of the first aspect, the process can further include removing a portion of the second insulating layer, wherein removing a portion of the second insulating layer includes exposing the stressor layer within the first opening, the second opening, or any combination thereof. In a more particular embodiment, removing a portion of the second insulating layer includes performing a blanket etch process. In another more particular embodiment, the process can further include removing a portion of the stressor layer after removing a portion of the second insulating layer, wherein after removing a portion of the stressor layer, the first opening, the second opening, or any combination thereof extends through the stressor layer.

In another particular embodiment of the first aspect, the process can further include forming a silicide layer over the first conductive region, the second conductive region, or any combination thereof prior to forming the stressor layer, wherein the silicide layer includes nickel, cobalt, tungsten, or any combination thereof. In a more particular embodiment, depositing the stressor layer is performed after forming the silicide layer and before forming the second insulating layer. In still another particular embodiment, forming the stressor layer includes depositing a nitrogen-containing insulating material, and forming the second insulating layer includes depositing an oxygen-containing material. In a more particular embodiment, depositing the stressor layer includes depositing the stressor layer such that the stressor layer within the first opening has a compressive stress and the stressor layer within the second opening has a tensile stress.

In another embodiment of the first aspect, forming the first conductive region within the substrate corresponding to the first component includes forming the first conductive region within the substrate corresponding to the first component, wherein the first component includes a first transistor. Also, forming a second conductive region within the substrate and adjacent to the first conductive region, wherein the second conductive region corresponds to a second component includes forming a second conductive region within the substrate and adjacent to the first conductive region, wherein the second conductive region corresponds to a second component, wherein the second component includes a second transistor.

In a second aspect, a process of forming an electronic device can include forming a first conductive region corresponding to a first component, and forming a second conductive region and adjacent to the first conductive region, wherein the second conductive region corresponds to a second component. The process can also include forming a silicide layer over the first conductive region and the second conductive region, and depositing an etch-stop layer over the silicide layer. The process can further include forming a first insulating layer over the etch-stop layer, wherein forming the first insulating layer includes forming a void within the first insulating layer, wherein, from a top view, the void extends between the first conductive region and the second conductive region. The process can still further include forming a first opening through a first portion of the first insulating layer and a second opening through a second portion of the first insulating layer. The first portion can overlie the first conductive region, and the second portion can overlie the second conductive region. The void can connect the first opening and the second opening, and the etch-stop layer can lie between the silicide layer and a bottom of the first opening, and between the silicide layer and a bottom of the second opening. The process can also include forming a second insulating layer within the first opening, the second opening, or any combination thereof wherein forming the second insulating layer includes substantially blocking the void, and removing a portion of the second insulating layer wherein after removing a portion of the second insulating layer the void remains substantially blocked. The process can further include removing a portion of the etch-stop layer after removing a portion of the second insulating layer, wherein removing a portion of the etch-stop layer exposes the silicide layer within the first opening and the second opening.

In one embodiment of the second aspect, forming the etch-stop layer includes forming a nitrogen-containing insulating material, and forming the first insulating layer includes forming an oxygen-containing material. In another embodiment, forming the silicide layer includes forming the silicide layer including europium, nickel, titanium, ytterbium, yttrium or any combination thereof. In still another embodiment, forming the silicide layer includes forming a silicide layer that increases in resistivity when exposed to oxygen at no more than 450 degrees centigrade.

In a particular embodiment of the second aspect, the process can further include depositing a conductive material within the first opening and the second opening after removing the portion of the etch-stop layer, wherein after depositing the conductive material substantially none of the conductive material lies within the void. In another particular embodiment, the process can further include removing a portion of the conductive material wherein after removing a portion of the conductive material, substantially none of the conductive material lies between the first opening and the second opening.

In another embodiment of the second aspect, removing a portion of the second insulating layer includes performing a blanket etch process. In still another embodiment, the first conductive region is an n-channel region and the second conductive region is a p-channel region.

In a third aspect, an electronic device can include a first conductive region at a substrate, a second conductive region at the substrate adjacent to the first conductive region, and a nitride layer over the first conductive region and the second conductive region. The electronic device can also include a first insulating layer over the nitride layer, wherein, from a top view, the first insulating layer includes a void lying between the first conductive region and the second conductive region. The electronic device can further include a first section of a first opening through a first portion of the first insulating layer. The first portion can overlie the first conductive region, and the first opening can intersect the void. The electronic device can also include a first section of a second opening through a second portion of the first insulating layer. The second portion can overlie the second conductive region, and the second contact opening can intersect the void. The electronic device can further include a second insulating layer, lying within the first opening and the second opening, wherein the second insulating layer substantially blocks the void. The electronic device still further can include a second section of the first opening through the nitride layer, contiguous with the first section of the first opening. From a top view, the second section of the first opening can lie within the first section of the first opening, and substantially none of the second insulating layer can lie within the second section of the first opening. The nitride layer can lie exposed along a perimeter of the second section of the first opening.

In a particular embodiment of the third aspect, from a top view, within the first opening, a perimeter defined by an inward-facing surface of the second insulating layer substantially overlies the perimeter of the second section of the first opening. In a more particular embodiment the electronic device can further include a conductive plug within the first opening, wherein the conductive plug electrically connects to the first conductive region and not the second conductive region Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

The above-disclosed subject matter is to be considered illustrative, and not restrictive, and the appended claims are intended to cover all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming an electronic device comprising:
   forming a first conductive region within a substrate corresponding to a first component;
   forming a second conductive region within the substrate and adjacent to the first conductive region, wherein the second conductive region corresponds to a second component;
   depositing a stressor layer including an insulating material over the first conductive region and the second conductive region;
   forming a first insulating layer over the stressor layer, wherein forming the first insulating layer includes forming a void within the first insulating layer and wherein, from a top view, the void lies between the first conductive region and the second conductive region;
   forming a first opening through a first portion of the first insulating layer and a second opening through a second portion of the first insulating layer, wherein:
   the first portion overlies the first conductive region;
   the second portion overlies the second conductive region;
   the void connects the first opening and the second opening; and
   the stressor layer lies between the first conductive region and a bottom of the first opening, and between the second conductive region and a bottom of the second opening;
   forming a second insulating layer over the stressor layer within the first opening, the second opening, or any combination thereof, wherein forming the second insulating layer includes substantially blocking the void.

2. The process of claim 1, wherein forming the stressor layer comprises depositing a silicon nitride.

3. The process of claim 2, wherein removing a portion of the second insulating layer includes performing a blanket etch process.

4. The process of claim 2, wherein forming the second insulating layer comprises depositing an oxide material.

5. The process of claim 1, further comprising forming a silicide layer over the first conductive region, the second conductive region, or any combination thereof prior to forming the stressor layer, wherein the silicide layer includes nickel, cobalt, tungsten, or any combination thereof 6. The process of claim 5, wherein depositing the stressor layer is performed after forming the silicide layer and before forming the second insulating layer.

7. The process of claim 1, wherein:
   forming the stressor layer includes depositing a nitrogen-containing insulating material; and
   forming the second insulating layer includes depositing an oxygen-containing material 8. The process of claim 7, wherein depositing the stressor layer includes depositing the stressor layer such that the stressor layer within the first opening has a compressive stress and the stressor layer within the second opening has a tensile stress.

9. The process of claim 1, wherein:
forming the first conductive region within the substrate corresponding to the first component includes forming the first conductive region within the substrate corresponding to the first component wherein the first component includes a first transistor; and
forming a second conductive region within the substrate and adjacent to the first conductive region, wherein the second conductive region corresponds to a second component includes forming a second conductive region within the substrate and adjacent to the first conductive region, wherein the second conductive region corresponds to a second component, wherein the second component includes a second transistor.

10. A process of forming an electronic device comprising:
forming a first conductive region corresponding to a first component;
forming a second conductive region and adjacent to the first conductive region, wherein the second conductive region corresponds to a second component;
forming a silicide layer over the first conductive region and the second conductive region;
depositing an etch-stop layer over the silicide layer;
forming a first insulating layer over the etch-stop layer, wherein forming the first insulating layer includes forming a void within the first insulating layer, wherein, from a top view, the void extends between the first conductive region and the second conductive region;
forming a first opening through a first portion of the first insulating layer and a second opening though a second portion of the first insulating layer, wherein:
the first portion overlies the first conductive region;
the second portion overlies the second conductive region;
the void connects the first opening and the second opening; and
after forming the first and second opening, the etch-stop layer lies between the silicide layer and a bottom of the first opening, and between the silicide layer and a bottom of the second opening;
forming a second insulating layer within the first opening, the second opening, or any combination thereof wherein forming the second insulating layer includes substantially blocking the void, wherein the etch-stop layer lies between the second insulating layer and the silicide layer; and
removing portions of the etch-stop layer and the second insulating layer within the first and second openings to expose the first and second conductive regions, wherein after removing portions of the etch-stop layer and the second insulating layer, a remaining portion of the second insulating layer substantially blocks the void.

11. The process of claim 10, wherein:
forming the etch-stop layer includes depositing silicon nitride; and
forming the second insulating layer includes depositing an oxide material.

12. The process of claim 10, wherein forming the silicide layer includes forming the silicide layer including europium, nickel, titanium, ytterbium, yttrium or any combination thereof.

13. The process of claim 11, wherein forming the first insulating layer including depositing the oxide material.

14. The process of claim 10, further including depositing a conductive material within the first opening and the second opening after removing the portion of the etch-stop layer, wherein after depositing the conductive material substantially none of the conductive material lies within the void.

15. The process of claim 14, further including removing a portion of the conductive material wherein after removing a portion of the conductive material, substantially none of the conductive material lies between the first opening and the second opening.

16. The process of claim 10, wherein removing a portion of the second insulating layer includes performing a blanket etch process.

17. The process of claim 10, wherein the first conductive region is an n-channel region and the second conductive region is a p-channel region.

18. The method of claim 10, wherein forming the second insulating layer comprises forming the second insulating layer having a thickness that is at most ⅓ of a width of the first opening, the second opening, or both.

19. The method of claim 1, wherein forming the second insulating layer comprises forming the second insulating layer having a thickness that is at most ⅓ of a width of the first opening, the second opening, or both.

20. The method of claim 4, wherein forming the first insulating layer comprises depositing the oxide material.

* * * * *